United States Patent [19]
Doi et al.

[11] Patent Number: 5,821,279
[45] Date of Patent: Oct. 13, 1998

[54] FILLING MATERIAL COMPOSITION USED FOR A PROCESS OF MANUFACTURING A PRINTED CIRCUIT BOARD WITH PLATED THROUGH-HOLES

[75] Inventors: Katsuo Doi, Joyo; Satoshi Miyayama; Toshikazu Oda, both of Uji, all of Japan

[73] Assignee: Goo Chemical Co., Ltd., Kyoto, Japan

[21] Appl. No.: 638,896

[22] Filed: Apr. 25, 1996

[30] Foreign Application Priority Data

Apr. 25, 1995 [JP] Japan ................................. 7-125730
Jan. 23, 1996 [JP] Japan ................................. 8-032601

[51] Int. Cl.$^6$ ............................. C08F 2/50; C08K 3/18; C08K 3/36
[52] U.S. Cl. ............................. 522/75; 522/79; 522/81; 522/83; 522/120; 522/141; 430/281.1; 430/311; 430/318; 428/209
[58] Field of Search .......................... 522/74, 79, 104, 522/144, 75, 81, 83, 120, 141; 430/281.1, 311, 318; 428/209

[56] References Cited

U.S. PATENT DOCUMENTS 4,985,474  1/1991  Ogitani et al. ........................ 522/107
5,212,213  5/1993  Hutter .................................... 522/107

FOREIGN PATENT DOCUMENTS 55-102290   8/1980   Japan .
58-202440  11/1983   Japan .
3277675 A  12/1991   Japan .
4-62887     2/1992   Japan .
07-331149  12/1995   Japan .

OTHER PUBLICATIONS translation of Japanese Kokai Patent No. Sho 62–59606, Somal Co., Ltd., Mar. 1987.

Primary Examiner—Susan W. Berman
Attorney, Agent, or Firm—Nikaido Marmelstein Murray & Oram, LLP

[57] ABSTRACT

A radiation curable filling material is used for a process of manufacturing a printed circuit board having plated landless through-holes. The material is filled in the through-holes and solidified in the through-holes via a photo polymerization to protect plated through-hole interior from an etching solution. The composition comprises a hydrophthalic acid monoester compound as a component (A); a catalyst for promoting photo polymerization of a vinyl group in the mono ester as a component (B); a highly transparent rosin having a Hazen color tone of 300 or less for the improvement of filling material transmission by radiation as a component (C), a powder of extender as a competent (D). The photo polymerization reaction occurs at the vinyl group of the hydrophthalic mono ester with the presence of the catalyst for promoting the photo polymerization. The rate of the reaction is enhanced by adding a vinyl compound such as an acrylate. The superior transmission of the highly transparent rosin enables to increase cure depth of the filling material.

3 Claims, 3 Drawing Sheets

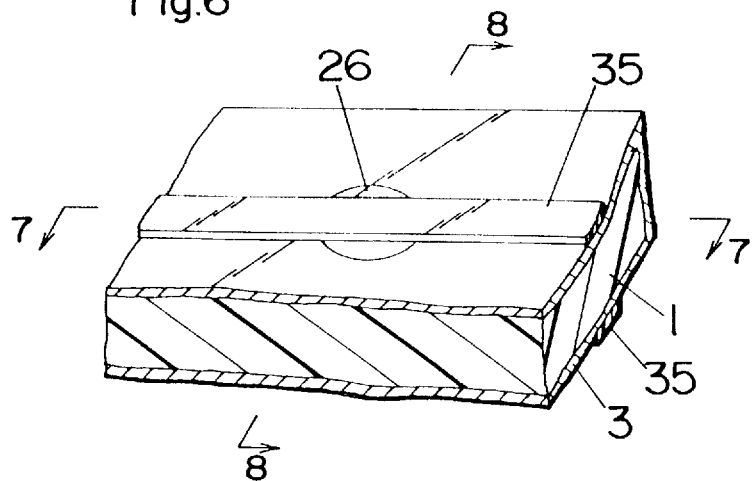
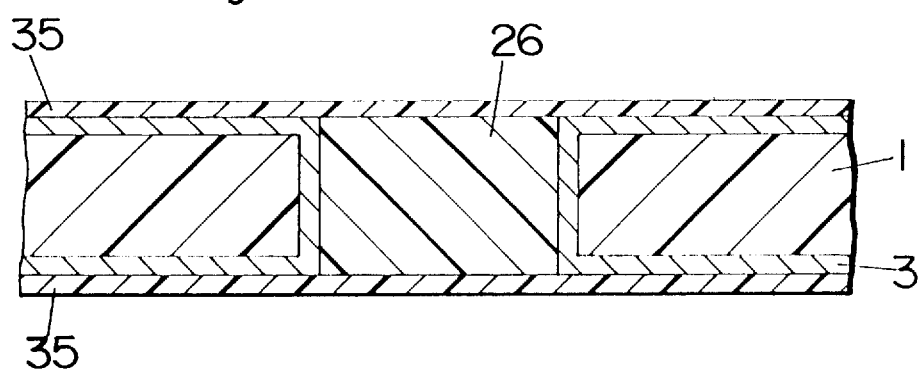
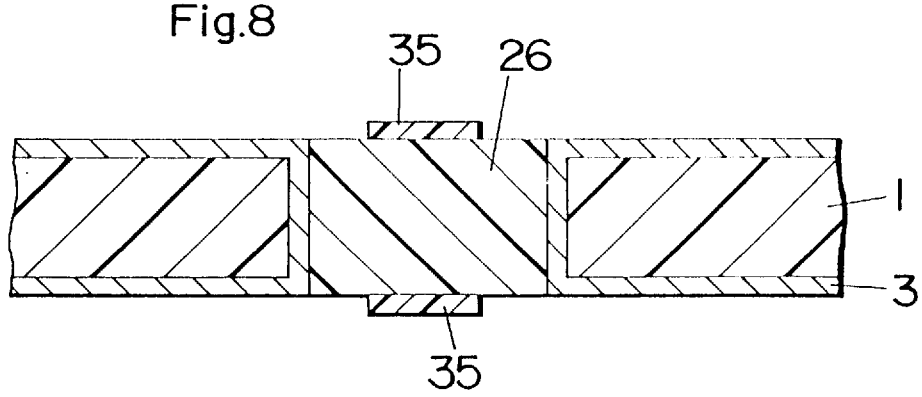

FILLING MATERIAL COMPOSITION USED FOR A PROCESS OF MANUFACTURING A PRINTED CIRCUIT BOARD WITH PLATED THROUGH-HOLES

BACKGROUND OF THE INVENTION

1. Field of the Invention

The present invention is related to a highly transparent filling material composition used for a process of manufacturing a printed circuit board with plated through-holes. The filling material is a radiation curable putty material to protect the plated through-holes during the process.

2. The Prior Art

Japanese Early Patent Examinations (KOKAI) 55-102290 discloses a process of manufacturing printed circuit board with electrically conductive through-holes by the use of an filling material for the through-holes prior to the preparation of a printed pattern on the board, which is so called the filling material process. The filling material comprises a rosin or rosin derivative, as a main component, a defoamer, an organic solvent, and an extender.

The process is disclosed in the publication above and Japanese Early Patent Examinations (KOKAI) 4-62887 and includes the following steps. First, a through-hole in a substrate connects electrically conductive layers on the substrate because an interior of the through-hole is plated with the same conductive material as the conductive layers so that the interior merges to the conductive layers.

Second, the through-holes are filled with the filling material, and the conductive layers are coated with the same filling material. The filling material was cured (or solidified) by exposing the material under light. The cured filling material on the conductive layers is removed by the use of a polishing tool, but the cured material in the through-holes remained.

Third, resist layers with a desired circuit pattern are placed on the cured material in the through-holes and the conductive layers, and, then, the resist layers are cured by exposing the resist layers under light.

Fourth, uncured portions of the resist layers are removed, and the corresponding resist-uncovered portions of the conductive layers are etched by the use of an etching solution such as $Fe(III)Cl_3$ and $Cu(II)Cl_2$.

Finally, the cured putty and the remaining of the cured resist layers are removed by the use of an alkaline solution to provide a printed circuit board with plated through-holes.

The filling material used in the filling material process included one of rosin resins of typically gum rosin, wood rosin, chemically modified hydrogenated rosin, rosin modified maleic acid, and rosin modified phenol resin. However, all of these rosins possess insufficient transmission for near infrared, visible, and UV light. Therefore, the filling material was cured incompletely by the radiation of the light. For this reason, an insufficiently cured portion of the prior art rosin caused undesirable spilling of the portion from the through-holes and difficult polishing of the filling material layers on the copper layers in the process.

Moreover, because of the poor light transmission of the prior art rosin it was extremely difficult to add an adequate amount of extenders such as silica, barium sulfate, and titanium oxide for the improvement of solubility of the cured filling material. This created a second problem wherein cured filling material remains partially in the interior of the through-hole after the use of the alkaline solution in the filling material process.

Also, the filling material often includes a defoamer of silicone. Nevertheless, when the resist layers are prepared on the landless through-holes, the defoamer leaks out (or bleeds) from the filling material into the resist layers. As a result, the resist layers are detached from the through-holes. After the etching step, plated edges of the through-holes are damaged as shown in FIG. 11.

Therefore, there is need for a filling material which includes a rosin having excellent light transmission to increase cure depth of the filling material for prevention of the spilling of the filling material from the through-holes and avoidance of difficulty in the polishing step, increases the amount of extender for obtaining complete removal of the cured putty and the resist with the alkaline solution, and uses no defoamer for elimination of the bleed.

SUMMARY OF THE INVENTION

It is a primary object of the present invention to provide a filling material composition comprising a hydrophthalic acid mono ester compound as a component (A); a catalyst for promoting photo polymerization of a vinyl group in the mono ester as a component (B); a highly transparent rosin selected at least one from the group consisting of a colorless rosin having a Hazen color tone of 300 or less and an acid value of 150–180 and a colorless rosin derivative having a Hazen color tone of 300 or less and an acid value of 150–500 for the improvement of filling material transmission by radiation as a component (C), a powder of at least one extender selected from talc, silica, aluminum hydroxide, titanium oxide, barium sulfate, kaolinite, calcium carbonate, and phthalocyanine as a competent (D). The light transmission of the component (C) is improved, compared with that of the prior rosin more than eight times. The superior transmission of the highly transparent rosin enables to increase cure depth of the filling material and the amount of extender which is added to the material.

It is another object of the present invention to provide the filling material composition include a vinyl compound as a component (E) in order to accelerate the cure of the filling material and improve viscosity of the material.

It is another object of the present invention to provide the filling material having no defoamer for the prevention of the bleed.

It is another object of the present invention to use the filling material in the process of manufacturing plated through-holes.

These and other objects, together with the advantages thereof over existing a prior art form, which will become apparent from the following specification or accomplished by means hereinafter described.

BRIEF EXPLANATION OF DRAWINGS

FIG. 6 illustrates a perspective front view of a resist strip provided on the through-hole and the substrate for manufacturing a landless through-hole.

FIG. 7 illustrates a cross sectional view taken along line 7—7.

FIG. 8 illustrates a cross sectional view taken along line 8—8.

DESCRIPTION OF PREFERRED EMBODIMENTS

Figure 1:
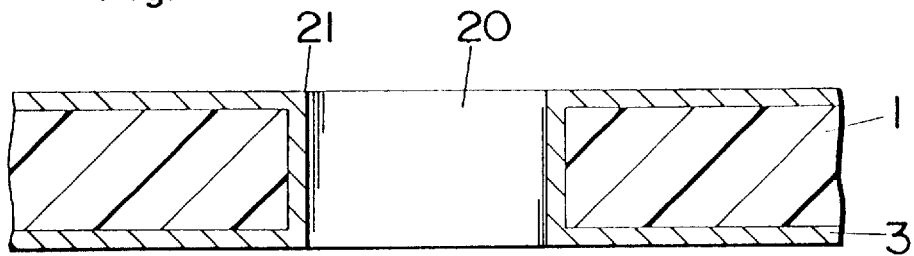
FIG. 1 illustrates a cross sectional view of a through-hole having a copper plated interior in a copper-layered substrate.

A radiation curable filling material is filled in through-holes provided in a substrate. The filling material comprises the followings: (A) a hydrophthalic acid monoester compound; (B) a catalyst for promoting photo polymerization of a vinyl group in the mono ester; (C) a highly transparent rosin selected from at least one of the group consisting of a colorless rosin having an acid value 150–180 and a Hazen color tone of 300 or less and a colorless rosin derivative having an acid value 150–500 and a Hazen color tone of 300 or less; and (D) a powder of an extender.

The filling material in the through-holes is cured by exposing it under infrared, visible, or UV radiation. In this curing step, the material undergoes a photo polymerization of the vinyl group of the hydrophthalic mono ester with the presence of the photo polymerization promoting catalyst.

The hydrophthalic mono ester compound of the component (A) is prepared by reacting a polybasic acid (polycarboxlic acid) with an alcohol having an unsaturated vinyl group. The acid monoester has the following formula (I):

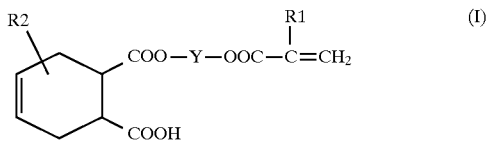

wherein R1 represents a hydrogen or a methyl group, R2 represents a hydrogen or an alkyl group of C1–C4; Y represents an alkylene group of C1–C4 or a group of —(CnH2nO)p—CH2—, wherein n is an integer from 2 to 6 and p is an integer from 1 to 19.

Any polybasic acid may be used, for example, such as tetrahydro phthalic acid, 3-methyl tetrahydro phthalic acid, 4-methyl tetrahydro phthalic acid, 3-ethyl tetrahydro phthalic acid, 4-ethyl tetrahydro phthalic acid, 3-propyl tetrahydro phthalic acid, 4-propyl tetrahydro phthalic acid, 3-butyl tetrahydro phthalic acid, 4-butyl tetrahydro phthalic acid, hexahydro phthalic acid, 3-methyl hexahydro phthalic acid, 4-methyl hexahydro phthalic acid, 3-ethyl hexahydro phthalic acid, 4-ethyl hexahydro phthalic acid, 3-propyl hexahydro phthalic acid, 4-propyl hexahydro phthalic acid, 3-butyl hexahydro phthalic acid, and 4-butyl hexahydro phthalic acid.

Preferred polybasic acids are tetrahydro phthalic acid, 3-methyl tetrahydro phthalic acid, 4-methyl tetrahydro phthalic acid, hexahydro phthalic acid, 3-methyl hexahydro phthalic acid, 4-methyl hexahydro phthalic acid for the enhancement of solubility in an alkaline solution.

Any alcohol having an unsaturated vinyl group may be used, for example, such as 2-hydroxyethyl (meth) acrylate, 2-hydroxypropyl (meth) acrylate, 2-hydroxybutyl (meth) acrylate, polyethyleneglycol mono (meth) acrylate, polypropyleneglycol mono (meth) acrylate, polybutyleneglycol mono (meth) acrylate, polycaprolactone mono (meth) acrylate.

The hydrophthalic mono ester compound is easily prepared by using a conventional synthetic method for ester. In particular, the compound is prepared by the ring opening addition of the aforementioned alcohol having a vinyl group to an anhydride of the aforementioned polybasic acid. Tetrahydrophthalic mono ester compounds are represented by the chemical formula (I). It is possible to use the two kinds of the mono esters simultaneously.

A preferred amount of the hydrophthalic acid mono ester compound is 1–70% by weight with respect to a total amount of the filling material composition. If the amount is less than 1% by weight, then solubility of the material in an alkaline solution, during a removal of a cured filling material in the though-hole and a cured resist, decreases. And if the amount exceeds 70% by weight, then viscosity of the material increases, causing a difficult filling of the material in a through-hole. The most preferred amount range of the mono ester is 5–50% by weight.

Any suitable catalyst for promoting photo polymerization of the vinyl group in the component (A) can be chosen, for example, from any of conventional catalysts which generates radicals or Lewis acids under an exposure of near infrared, visible, or UV light. In particular, UV sensitive catalysts are preferred.

Suitable catalysts for promoting radical photo polymerization reactions are benzophenone; vicinal ketones such as diacetyl and dibenzyl; acyloins such as pivaloin and α-pyridoin; benzoins such as benzoin methyl ether, benzoin ethyl ether, benzoin isopropyl ether, benzoin isobutyl ether; benzyl dimethyl ketal; acetophenones such as 4-phenoxy dichloro acetophenone, 4-t-butyl dichloro acetophenone, and diethoxy acetophenone; thioxanthones such as 2,4-dimethylthioxanthone, 2,4-diethylthioxanthone, 2-chlorothioxanthone, 2-methylthioxanthone, isopropylthioxanthone, and 2,4-dichlorothioxanthone, dipropylthioxthanthone; anthraquinones such as ethyl anthraquinone, benzanthraquinone, diaminoanthraquinone; and others such as camphorquinone, 4-4'-bis (dimethylamino) benzophenone, dibenzosuberone, 4,4'-diethyl isophthaloyl phenone, 2-methyl-1-[4-(methylthio) phenyl]-2-morpholin-1-propanone, acyl phosphine oxide, and 2,4,6-trimethyl benzoyldiphenyl phosphine oxide.

It is possible to use more than two kinds of the radical photo polymerization promoting catalysts. Preferred radical photo polymerization promoting catalysts are benzyl methyl ketal, the benzophenones, the thioxanthones, and the anthraquinones.

Suitable catalysts for promoting cation photo polymerization are salts of any one of the following cations: aryl diazonimum, diaryl holonium, triphenyl phosphonium, dialkyl-4-hydroxy sulfonium, dialkyl-4-hydroxy phenyl sulfonium, and arene-iron complexes. The salts are $PF_6^-$, $AsF_6^-$, $BF_4^-$, and $SbF_6^-$.

It is possible to use the radical photo polymerization catalysts and the cation photo polymerization catalysts simultaneously. In addition to these catalysts, amine catalysts for helping the photo polymerization are used.

Such amine catalysts are aliphatic and aromatic amines: for example, triethylene tetramine, triethanol amine, methyl diethanol amine, triisopropanol amine, n-butyl amine, N-methyl diethanol amine, diethyl amino ethyl (meth) acrylate, Michler's ketone, 4,4-diethyl aminophenone, 4-dimethyl amino benzoic acid ethyl ester, 4-dimethyl amino benzoic acid (n-butoxy) ethyl ester, and 4-dimethyl amino benzoic acid isoamyl ester.

Preferred amine catalysts are Michler's ketone, 4,4'-diethyl amino phenone, 4-dimethyl amino benzoic acid ethyl ester, 4-dimethyl amino benzoic acid (n-butoxy) ethyl ester, and 4-dimethyl amino benzoic acid isoamyl ester. These aromatic amines are used to increase cure depth of the cured putty in a through-hole after an exposure of light.

Moreover, suitable compounds for increasing the sensitivity of the light, which is typically produced by a LASER device, for the catalysts are 7-diethyl amino-4-methyl coumarin, 4,6-diethyl-7-ethyl amino coumarin, carbocyanines, xanthenes, and the like.

A preferred amount of the component (B) is 0.01–20% by weight with respect to the total amount of the filling material. If the amount is less than 0.01% by weight, then the cure depth of the material by an appropriate light exposure is reduced. And, if the amount exceeds 20% by weight, then the resistance of the material against an etching solution is reduced.

The colorless rosin derivative in the component (C) is prepared by hydrogenating an adduct of a purified rosin to at least one acid selected from the group consisting of an α, β-unsaturated monocarboxylic acid and an α, β-unsaturated dicarboxylic acid. The α, β-unsaturated monocarboxylic acid is chosen, for example, from acrylic acid, methacrylic acid, and crotonic acid. And the α, β-unsaturated dicarboxylic acid is chosen, for example, from maleic acid, maleic acid anhydride, and fumaric acid.

The purified rosin is, for example, made by removing unsaponifiable matters from crude rosins such as gum rosin, wood rosin, and tall oil. The crude rosin comprises at least one rosin acid selected from the group consisting of abietic acid, palustric acid, neo-abietic acid, pimaric acid, isopimaric acid, dehydro abietic acid. A removal method of the unsaponifiable matters from the crude rosins is selected one from distillation, recrystalization, extraction. It is preferred to use the distillation method for the preparation of colorless rosin derivatives having high light transmission.

A Diels-Alder reaction is used for the addition of the purified rosin to at least one acid selected from the group consisting of an α, β-unsaturated monocarboxylic acid and an β-unsaturated dicarboxylic acid. The addition is, for example, performed at 180–240 degrees Celsius for 1–9 hours with the presence of a noble gas. The hydrogenation of the addition product is, for example, performed in the presence of palladium carbon (Pd/C) or rhodium carbon (Rh/C) under an atmospheric or applied pressure with the present of heat.

The colorless rosin derivative used in the present invention is required to have a Hazen color tone of 300 or less. The prior art rosin such as rosin modified maleic acid has a Gardner color tone of 8–12. A Hazen color tone of 400 is equal to a Gardner color tone of 1.

Super light color rosin [KE-610]: a colorless rosin derivative (product of ARAKAWA Chemical Co, Ltd., having a Hazen color tone of 50, acid value of 254, melting temperature 132 degrees Celsius) can be used as the colorless rosin derivative. This derivative is disclosed in Japanese Early Examination Patent (KOKAI) 3-277675.

The colorless rosin derivative is required to have an acid value 150–500. If the acid value is less than 100, then the solubility of the material in an alkaline solution is reduced. And if the acid value is greater than 500, then resistance of the material against the acidity of an etchant is reduced, resulting in weakening the protective effect of the material in a through-hole. It is most preferred to use a rosin derivative having an acid value 150–400.

The colorless rosin in the component (C) is prepared simply by hydrogenating the purified rosin in the presence of palladium carbon (Pd/C) or rhodium carbon (Rh/C) under an atmospheric or applied pressure with the presence of heat.

The colorless rosin has a Hazen color tone of 300 or less and an acid value of 150–180.

Super light color rosin: a colorless rosin, such as that sold by ARAKAWA Chemical Co, Ltd., under the tradename KE-604 having a Hazen color tone of 60, acid value of 170, melting temperature 85 degrees Celsius) can be used as the colorless rosin. This rosin is also disclosed in Japanese Early Examination Patent (KOKAI) 5-86334.

The highly transparent rosin (C) for the present invention is either the colorless rosin or the colorless rosin derivative.

The transmission of the highly transparent rosin (C) is superior to that of the conventional rosin resin. Therefore, the use of the rosin provides excellent cure depth of the material in the through-hole. Moreover, the presence of the high transmission provides excellent soluble resistance of the filling material against a resist material used in the formation of resist layers, and excellent solubility of the material in an alkaline solution in the removal of the cured putty and the cured resist.

A preferred amount of the component (C) is 5–40% by weight with respect to the total amount of the filling material composition. This amount provides excellent cure depth of the material in a through-hole under an exposure of light and excellent solubility of the material against an alkaline solution. If the amount of the component (C) is less than 5% by weight, then the alkaline solution solubility of the material is reduced. And, if the amount is greater than 40% by weight, then the viscosity of the material increases, resulting in a difficult filling of the material in a through-hole.

Suitable extenders (D) are inorganic compounds such as talc, silica, aluminum hydroxide, titanium oxide, barium sulfate, kaolinite, calcium carbonate, and phthalocyanine; organic polymers such as polyethylene, nylon, polyester, and the like. Preferred extenders are the inorganic compounds.

Since the transmission of the highly transparent rosin is excellent, an amount of the extender of 20–90% by weight can be added to the filling material. The addition of this amount of the extender provides the improvement of a filling condition of the material in through-holes and the improvement of easiness in the removal of the cured putty and the cured resist portions. Moreover, the adequate amount of the extender allows the material to include no defoamer, preventing the filling material from bleeding in the resist layers, and this material composition still provides excellent cure depth. If the amount of the extender exceeds 90% by weight, then the filling step becomes extremely difficult by high viscosity.

Any vinyl compound is added to the filling material for an purpose of enhancing the rate of the photo polymerization reaction, as the component (E), in addition to the components (A), (B), (C), and (D).

Any suitable vinyl compound may be used, for example, such as 2-hydroxyethyl (meth) acrylate, 2-hydroxypropyl (meth) acrylate, cellosolve (meth) acrylate, methyl cellosolve (meth) acrylate, ethyl cellosolve (meth) acrylate, butyl cellosolve (meth) acrylate, diethyleneglycol mono acrylate, methyl carbitol (meth) acrylate, butyl carbitol, phenoxy ethyl (meth) acrylate, dichloropentadienyl (meth) acrylate, dichloropentadienyl oxyethyl (meth) acrylate, vinyl acetate, N-vinylpyrrolidone, (meth) acrylamide, tetrahydrofurfyl (meth) acrylate, polyethyleneglycol mono (meth) acrylate, polypropyleneglycol mono (meth) acrylate, polybutyleneglycol mono (meth) acrylate, polycaprolactone mono (meth) acrylate, phenyl glycidyl ether (meth) acrylate, polyethyleneglycol di (meth) acrylate, polypropyleneglycol di (meth) acrylate, polybutyleneglycol di (meth) acrylate, and polycaprolactone di (meth) acrylate.

A preferred amount range of the vinyl compound is 2–50% by weight with respect to the total amount of the filling material composition. If the amount exceeds 50% by weight, then the solubility of the filling material in an alkaline solution is reduced, resulting in a difficult removal of the material from the through-holes.

The components (A), (B), (C), (D), and (E) together the additives are blended in a certain container with a mixer. This mixed filling material is used in a process of manufacturing a printed circuit board having through-holes without lands.

A process of manufacturing a printed circuit board with landless through-holes by the use of the mixed material composition is explained below.

As shown in FIG. 1, a though-hole 20 is provided in a substrate 1 by using a drill. An interior of the through-hole 20 and each of opposing surfaces of the substrate 1 (substrate surfaces) are plated with copper in order to form a copper layer 3 on the substrate surfaces and the interior.

Alternatively, it is possible to use a substrate 1 which has already a copper layer 3 on each of substrate surfaces prior to the preparation of a through-hole 20. Then, a through-hole 20 is provided in the substrate 1 with the copper layers 3 by using a drill, and an interior of the through-hole 20 is plated with copper in order to form a copper layer 3. Thus, the interior copper layer 3 is continues with the copper layers 3 around a through-hole edges 21 so that the copper layers 3 are electrically conductive via the interior copper layer 3.

The substrate 1 is made from a paper, glass fiber, ceramic or metal base material coated with a resin or Teflon.

Figure 2:
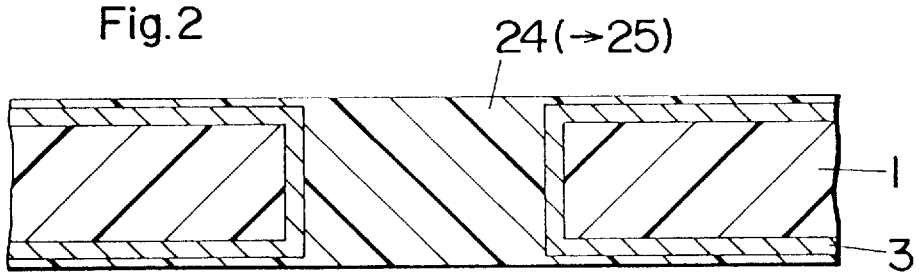
FIG. 2 illustrates a cross sectional view of the through-hole filled with a cured filling material and the substrate which is coated with the cured filling material layers.

As shown in FIG. 2, the through-hole 20 is filled with a filling material 24 having its composition described above by using conventional filling techniques such as dip, screen process printing, pin, roll filling methods, and the copper layers 3 are coated with the material 24 as well. After the filling step, the material 24 is exposed in a high pressure mercury or metal hydride lamp at light energy per surface of 50–2000 mJ in order to cure the material 24, which the liquid material 24 is converted photochemically into a solidified (or cured) filling material 25. With this exposure, it is possible to gain cure depth for the cured material 25 of 700 $\mu$ m or greater.

Figure 3:
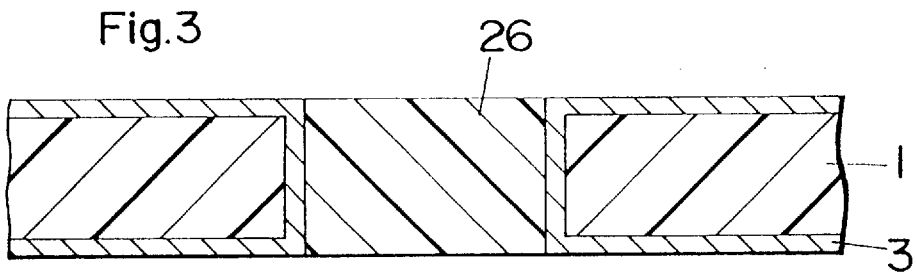
FIG. 3 illustrates a cross sectional view of the through-hole filled with the cured filling material and the substrate which the cured filling material layers have been removed.

As shown in FIG. 3, the cured material 25 on the copper layers 3 is removed with a belt-sander, buff, or slab polishing mechanical tool at a low polishing pressure; then only a cured putty 26, the cured material 25 in the through-hole 20, is remained. As a result, no crack or chip of the cured putty 26 is present around the through-hole edge 21; a filling efficiency (defined as the volume of the cured putty 26 divided by the volume of the through-hole 20 multiplied by 100%) at a range between 90% to 100% is obtained; ends of the cured putty 26 are leveled approximately even and smooth with the copper layers 3.

Figure 4:
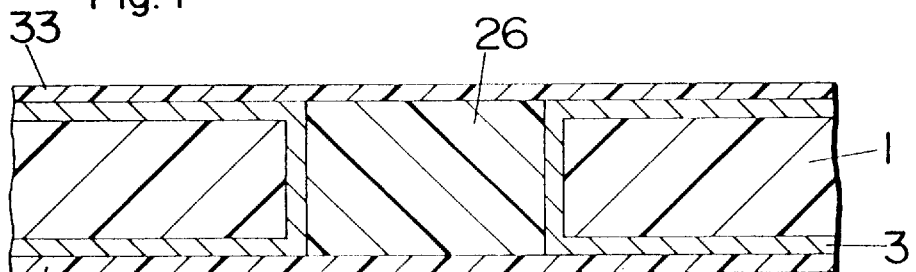
FIG. 4 illustrates a cross sectional view of the through-hole filled with the cured filling material, a liquid resist layer, and the substrate.

As shown in FIG. 4, a photo imageable liquid resist for etching is coated on the copper layers 3 and the ends of the cured putty 26 by using conventional techniques such as screen printing process, curtain coating, roll coating, spin coating, and spraying methods. The resist layers 33 are dried with a heater to form dried resist layers 34.

Figure 5:
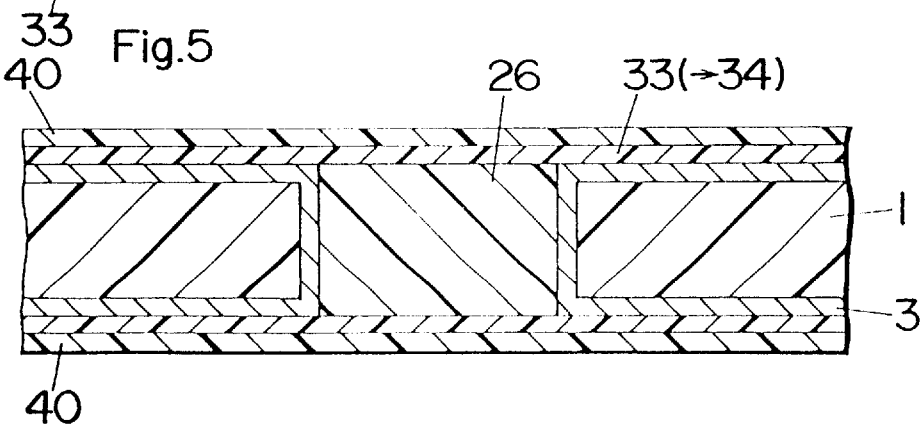
FIG. 5 illustrates a cross sectional view of the through-hole filled with the cured filling material, a dried resist layer, a mask, and the substrate.

As shown in FIG. 5, a mask 40 having a circuit pattern of a strip shape is placed on each of the dried resist layers 34. Then, near infrared, visible, or UV light is radiated on the entire resist layers 34 and the mask 40 surfaces of the substrate 1. A portion of the resist layer 34 under the strip of the mask 40 is cured. Then, the mask 40 is removed. The uncured portion of the resist layers 34 is treated by a weak alkaline solution and removed off from the substrate 1, leaving a cured resist strip 35 on the copper layer 3.

As shown in FIG. 6, a width of the resist strip 35 is smaller than a diameter of the through-hole so that portions of the cured putty 26 uncovered by the strip 35 are exposed in air. A longitudinal cross section taken along line 7—7 is shown in FIG. 7, while a lateral cross section taken along line 8—8 is shown in FIG. 8.

Portions of the copper layers 3 uncovered by the resist strip 35 were etched by the use of an iron (III) chloride or copper (II) chloride solution. In this step, the resist strip 35 covers the remaining part of the copper layer 3 which provides the circuit pattern. The same etching step was done on the other surface of the substrate 1.

Figure 9:
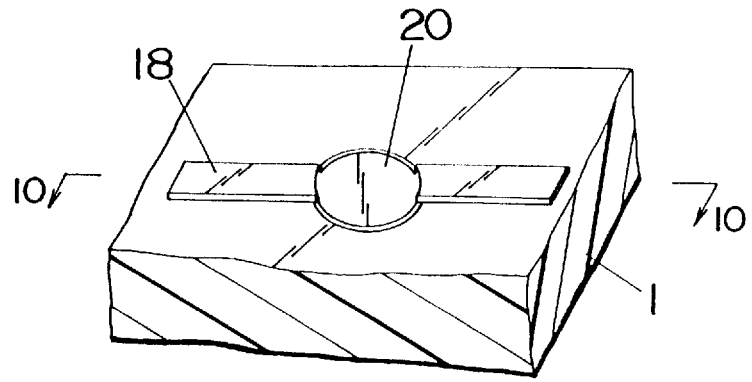
FIG. 9 illustrates a perspective front view of the landless through-hole.

As shown in FIG. 9, after the etching step, the resist strip 35 and the cured putty 26 are removed from the substrate 1 by the use of one of the following solutions: inorganic alkaline aqueous solutions such as caustic soda, caustic potash, and metasilicic acid soda; and organic alkaline aqueous solutions such as alkyl amine and alkanol amine.

Figure 10:
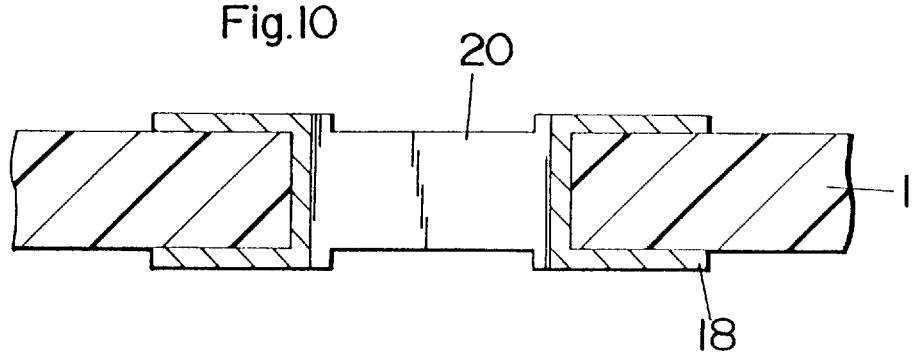
FIG. 10 illustrates a cross sectional view taken along line 10—10.
Figure 11:
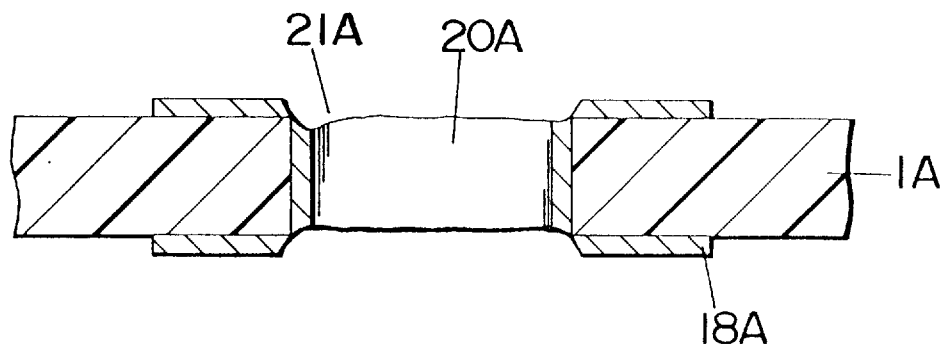
FIG. 11 illustrates a cross sectional view of a landless through-hole having damaged edges.

As shown in FIG. 10, a printed circuit pattern 18 of the copper layer 3 is provided on each of the substrate surfaces.

EXAMPLE 1

Exactly 3000 through-holes were drilled in a previously copper layered panel, which is a glass fiber board material fused-coated with epoxy resin and layered with copper. The panel is a glass epoxy double side copper plated board, such as that sold for instance by Matsushita Electric Works, Co, Ltd., under the tradename R1705, having a 1.6 mm board thickness, a 330 mm×330 mm board dimension, and a 35 $\mu$m copper layer thickness).

Interiors of the through-holes were plated with copper to form a copper plated layer, having a 30 $\mu$m copper layer thickness, for each of the through-holes. A diameter of the through-hole was 0.3 mm. And, each of the copper layers was plated entirely with a copper layer having an additional 30 $\mu$m copper layer thickness.

The mixed material composition of the present invention described previously was filled in the through-holes and coated on each of the copper layers. The filling material composition consisted of two kinds of the component (A): a hydrophthalic mono ester compound (A-1) and another mono ester compound (A-2); two kinds of the component (B): benzyl dimethyl ketal and 2-ethyl anthraquinone; one kind of the component (C): Super light color rosin, i.e., a highly transparent resin, such as that sold for instance by Arakawa Chemical Industry Co., Ltd, under the tradename "KR-610"; three kinds of the component (D): AEROSIL 200, TOKUSEAL P, and BF-20; one kind of the component (E): 2-hydroxy ethyl methyl acrylate. Amounts of these ingredients for the material composition are listed in TABLE I, and commercial names of some of the ingredients are explained thereafter.

Preparations for making hydrophthalic mono esters (A-1), (A-2), and (A-3) are described below Preparation of a hydrophthalic mono ester compound (A-1): Hexahydro phthalic acid anhydride 154 g (1 mole), 2-hydroxyethyl acrylate 116 g (1 mole), N, N-dimethyl benzyl amine 0.1 g, and hydroquinone mono methyl ether 0.1 g were mixed in a flask. The resulting mixture was stirred, air-bubbled, heated at 95 degrees Celsius until an infrared spectrum peak for the anhydride ring disappears (about 24 hours);

Preparation of a hydrophthalic mono ester compound (A-2): 4-methyl hexahydro phthalic acid anhydride 168 g (1 mole), 2-hydroxypropyl methyl acrylate 144 g (1 mole), N,N-dimethyl benzyl diamine 0.1 g, and hydroquinone 0.3 g were mixed in a flask. The resulting mixture was reacted in the same reaction condition described above.

Preparation of a hydrophthalic mono ester compound (A-3): Tetrahydro phthalic acid anhydride 152 g (1 mole), 2-hydroxyethyl acrylate 144 g (1 mole), N,N-dimethyl benzyl diamine 0.1 g, and hydroquinone 0.3 g were mixed in a flask. The resulting mixture was reacted in the same reaction condition described above.

The filling material on the panel was squeegeed in order to wipe excess of the filling material (not in the through-holes) and make the filling material layers flat. Each side of the panel was exposed under light by using a high pressure mercury lamp at light energy per surface of 1000 mJ in order to cure the material layers.

The cured material layers were removed by polishing the cured layers with, first, a wet belt sander, such as that sold for instance by Marugen Iron Works Co, Ltd., under the trademark BELT SANDER having a belt at No. 400, using a loaded current 2 A), second, a four axis double side polisher, such as that sold for instance by Ishii Hyoki Co, Ltd. under the tradename "IOP-600") having a buffing sander used for the surface of a panel for manufacturing a printed circuit board, such as that sold for instance by Sumitomo 3M Co, Ltd., under the trademark "CP Wheel VF"). Now only the cured putties were remained in the through-holes.

After the polishing step, a photo imageable liquid resist for etching such as that sold by GOO Chemical Co, Ltd. under the trademark "EKIRESIN PER-800 (RB-102)") was coated on each of the copper layers and the ends of the cured putties by using a coating device [Lateral Double side Roll Coater] (product of Furnace Co, Ltd.). Then, opposite surfaces of the panel were dried with a far infrared drier at 70 degrees Celsius for 3 minutes in order to form dried resist layers.

A mask having a strip printed circuit pattern was placed on each of the resist layers. The panel having the copper layers, the cured putties in the through-holes, the dried resist layers, and the masks on its surfaces were exposed under light generated by exposure equipment having a photoresist double side radiating lamp, such as that sold for instance by Orc Manufacturing Co, Ltd. under the tradename "HMW 201GX") at light energy of 100 mJ per substrate surface.

After the exposure, the resist layers were developed by using a sodium carbonate aqueous solution (1% by weight). Then, the copper layers uncovered by portions of the resist layers were removed off from the panel by the use of an etching solution of Cu(II)Cl$_2$ at 50 degrees Celsius and rinsed with water.

The portions of the resist layers and the cured putties were removed off from the panel by the use of a sodium hydroxide aqueous solution (3% by weight). Then, landless through-holes were provided in the panels.

Quality of the panel was evaluated by using (1) a polish test, (2) a resist coat test, (3) a copper layer etching test, and (4) an electrical conductivity test.

The polish test examines easiness of removing the filling material layers with the polishers described before by checking the presence or absence of chips around edges of a cured putty and cured filling material residues on the panel surfaces.

The resist coating test examines a condition on the coating the liquid resist on the copper layers and the ends of the cured putty by checking the presence or absence of bleeding of the cured putty to the resist layers, a condition of the cured resist by checking the presence or absence of detachment or separation of the resist layers from the copper layers and cured putty. A good liquid resist coating condition shows even and smooth coating of the liquid resist, and a fair liquid coating condition indicates partially less even and less smooth coating but this coating is acceptable for use. Similarly, A good cured resist condition shows even and smooth formation of the dried resist, and a fair cured resist condition indicates partially less even and less smooth dried resist formation but this formation is acceptable for use.

The copper layer etching test to examine resistance strength against the etching solution for removing the portions of the copper layers by checking the presence of damages of the interior of a through-hole. A good etching condition shows no damages of the through-hole interior.

The electrical conductivity test to examine the presence or absence of interruption that caused by cracks in a plated through-hole interior. The presence of the interruption leads to ineffective conduction of the though-hole. A good conductivity indicates the absence of the interruption.

The cure depth of a cured putty, having a cylindrical closed shell of a cured substance and an cured liquid mixture in the shell, is measured by a process: to cut across a through-hole in the printed circuit board, to remove the cured putty and separate the uncured portion from the cured material in the through-hole, to measure the thickness of the cured substance with a measuring tool, such as that sold by Mitsutoyo Seisakusho, under the trademark "Micrometer 293".

The filling efficiency of the cured putty is determined. A filling condition was also evaluated visually. A good filling condition shows the filling efficiency of 95%–100%. A fair filling condition shows the filling efficiency of 90% to approximately 95%.

Results of these tests together with the cure conditions, the filling conditions, and time for the removal of the resist layers and the cured putty in minutes were listed in TABLE II.

EXAMPLES 2–7

The same printed circuit board manufacturing process, cure conditions, and quality tests in the example 1 were used in these examples. Only the difference between the example 1 and these examples were kinds and amounts of the material ingredients, which are listed in TABLE I. Results of the quality tests for these examples are also listed in TABLE II.

Noted that in the example 5 only 5% by weight of the component (D) was used.

COMPARATIVE EXAMPLES 1

The comparative example 1 employed the same printed circuit board manufacturing process, cure condition, and quality tests. A filling material composition in this comparative example used the same except the use of the prior art rosin consisting essentially of modified maleic acid resin, such as that sold by Arakawa Chemical Co., Ltd., under the trademark "MALKEED 31", instead of the component (C); the use of a defoamer silicone, such as that sold by Sinetsu Chemical Industry Co., Let., under the trademark "Shinetu Silicone [KS-66]"; and the use of only 5% by weight of the extender powder.

As a result, the cure depth of this composition reached only 400 μm. Since a part of uncured filling material composition bled in the resist layers. Thus, damages on the edges of a through-hole occurred after the etching step.

COMPARATIVE EXAMPLES 2

The comparative example 2 employed the same printed circuit board manufacturing process, cure condition, ingredients and quality tests as in the comparative example 1. Only the difference is the use of higher exposing light energy.

As a result, the cure depth of this composition reached 600 μm. Since a part of uncured filling material composition bled in the resist layers. Thus, damages on the edges of a through-hole occurred after the etching step.

COMPARATIVE EXAMPLE 3

The comparative example 3 employed the same printed circuit manufacturing process and quality tests. In this case, the amount of light energy was increased to 2000 mJ per panel surface, and no defoamer was used. Yet, the material was not cured sufficiently. Thus, the evaluation of the panel was extremely difficult.

Since the preferred embodiments of the present invention has been shown, it will be obvious to those skilled in the art that changes and modifications may be made without departing from the teachings of the present invention. It should be noted that the disclosed process can be used for manufacturing a printed circuit board having plated through-holes with lands.

Super light color rosin, a highly transparent rosin, such as that sold for instance by Arakawa Chemical Co, Ltd., under the tradename "KR-610" having a Hazen color tone of 60, acid value of 170, melting temperature 85 degrees Celsius). Super light color rosin a highly transparent rosin, such as that sold by Arakawa Chemical Co, Ltd., under the tradename "KE-604" having a Hazen color tone of 50, acid value of 254, melting temperature 132 degrees Celsius).
AEROSIL 1200: a fine powder silicate used for the extender, such as that sold for instance by Nippon Aerosil Co, Ltd., under the trademark "AEROSIL 1200".
Tokuseal P: a silicate used for the extender, such as that sold for instance by Tokuyama Co, Ltd. under the trademark "TOKUSEAL P".
BF-20: a barium sulfate, such as that sold for instance by Sakai Chemical Industry Co, under the tradename of BF-20).
MALKEED 31: a trademark rosin essentially consisting of modified maleic acid resin, sold by Arakawa Chemical Industry Co, Ltd., having a Gardner color tone of 9, an acid value of 200, and melting point 135 degrees Celsius).
SHINETU SILICONE [KS-66]: a trademarked defoamer silicone (sold by Shinetsu Chemical Industry Co, Ltd.

TABLE I

| Ingredients | Examples | | | | | | |
|---|---|---|---|---|---|---|---|
| | 1 | 2 | 3 | 4 | 5 | 6 | 7 |
| Component (A): | | | | | | | |
| hydrophthalic mono ester compound (A-1) | 13 | 23 | 13 | 8 | 40 | 13 | |
| hydrophthalic mono ester compound (A-2) | 20 | | | | | | |
| hydrophthalic mono ester compound (A-3) | | | | | | 20 | 13 |

TABLE I-continued

| Ingredients | Examples | | | | | | |
|---|---|---|---|---|---|---|---|
| | 1 | 2 | 3 | 4 | 5 | 6 | 7 |
| Component (B): | | | | | | | |
| benzyl dimethyl ketal | 0.5 | 0.5 | 0.5 | 0.5 | 0.5 | 0.5 | 1.0 |
| 2-ethyl anthraquinone | 0.5 | 0.5 | 0.5 | 0.5 | 0.5 | 0.5 | 0.2 |
| Component (C): | | | | | | | |
| Super light color rosin [KR-610] | 36 | | 16 | | 33 | 21 | |
| Super light color rosin [KE-604] | | 26 | | 6 | | | 9 |
| Component (D): | | | | | | | |
| AEROSIL 200 | 5 | 5 | 5 | 5 | 5 | 5 | 5 |
| TOKUSEAL P | 10 | 20 | 30 | 40 | | 10 | 30 |
| BF-20 | 10 | 20 | 30 | 40 | | 20 | 30 |
| Component (E): | | | | | | | |
| 2-hydroxyethyl methacrylate | 10 | | 10 | 5 | 20 | 10 | |
| diethyleneglycol mono acrylate | | 10 | | | | | 10 |

TABLE II

| | Examples | | | | | | |
|---|---|---|---|---|---|---|---|
| | 1 | 2 | 3 | 4 | 5 | 6 | 7 |
| Cure conditions: | | | | | | | |
| exposure light energy (mJ) per substrate surface | 1000 | 1000 | 1000 | 1000 | 1000 | 1000 | 1000 |
| cure depth (μm) | 1200 | 1000 | 900 | 800 | 1200 | 1200 | 1000 |
| Filling conditions: | | | | | | | |
| filling efficiency (%) | 96 | 96 | 98 | 98 | 93 | 98 | 98 |
| visual filling condition | good | good | good | good | fair | good | good |
| Polish test results: | | | | | | | |
| cured putty chips around though-hole edges | none | none | none | none | present | none | none |
| cured putty residuals on the panel surfaces | none | none | none | none | present | none | none |
| Resist coating test results: | | | | | | | |
| liquid resist coating condition | good | good | good | good | fair | good | good |
| cured resist condition | good | good | good | good | fair | good | good |
| Copper layer etching test result: | | | | | | | |
| etching condition | good | good | good | good | good | good | good |
| Electrical conductivity test result: | | | | | | | |
| the conductivity of a landless through-hole | good | good | good | good | good | good | good |
| cured putty and resist removing time (minutes) | 4 | 3 | 2 | 2 | 5 | 3 | 3 |

TABLE III

| Ingredients | Comparative Examples | | |
|---|---|---|---|
| | 1 | 1 | 2 |
| Component (A): | | | |
| hydrophthalic mono ester compound (A-1) | 40 | 40 | 13 |
| Component (B): | | | |
| benzyl dimethyl ketal | 0.5 | 0.5 | 0.5 |
| 2-ethyl anthraquinone | 0.5 | 0.5 | 0.5 |
| The prior art rosin: | | | |
| Malkeed 31 | 33 | 33 | 16 |
| Component (D): | | | |
| AEROSIL 200 | 5 | 5 | 5 |
| TOKUSEAL P | | | 30 |
| BF-20 | | | 30 |
| Component (E): | | | |
| 2-hydroxyethyl methacrylate | 20 | 20 | 10 |
| Defoamer: | | | |
| SHINETU SILICONE [KS-66] | 1 | 1 | |

TABLE IV

| | Comparative Examples | | |
|---|---|---|---|
| | 1 | 2 | 3 |
| Cure conditions: | | | |
| exposure light energy (mJ) per substrate surface | 1000 | 2000 | 2000 |
| cure depth ($\mu$m) | 400 | 600 | 28 |
| Filling conditions: | | | |
| filling efficiency (%) | 90 | 90 | insufficient cure |
| visual filling condition | fair | fair | undetermined |
| Polish test results: | | | |
| cured putty chips around though-hole edges | present | present | — |
| cured putty residuals on the panel surfaces | present | present | — |
| Resist coating test results: | | | |
| liquid resist coating condition | bleed | thickness reduced | — |
| cured resist condition | detachment | fair | — |
| Copper layer etching test result: | | | |
| etching condition | damaged edges | damaged edges | — |
| Electrical conductivity test result: | | | |
| the conductivity of a landless through-hole | interruption | interruption | — |
| cured putty and resist removing time (minutes) | 5 | 6 | — |

What is claimed is:

1. A filling material composition for electrically conductive through-holes on a printed circuit board comprising:

(A) 1–70% by weight, with respect to a total amount of the composition, of at least one hydrophthalic acid monoester compound selected from the group consisting of a first compound defined by the following structural formula (I) and a second compound defined by the following structural formula (II):

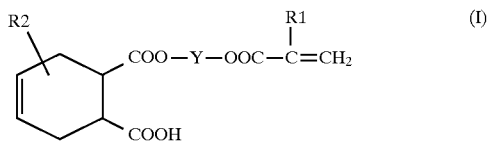

(I)

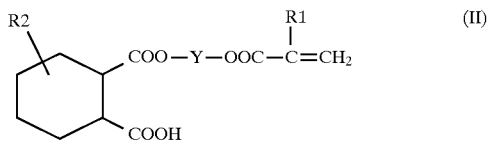

(II)

wherein R1 represents a hydrogen or a methyl group, R2 represents a hydrogen or an alkyl group of $C_1$–$C_4$; Y represents an alkylene group of $C_1$–$C_4$ or a group of —$(C_nH_{2n}O)_p$—$CH_2$—, wherein n is an integer from 2 to 6 and p is an integer from 1 to 19;

(B) 0.01–20% by weight, with respect to the total amount of the composition, of a catalyst for promoting photo polymerization of the vinyl group of the hydrophthalic acid monoester compound;

(C) 5–40% by weight, with respect to the total amount of the composition, of at least one transparent rosin selected from the group consisting of:

a colorless rosin, having an acid value 150–180 and a Hazen color tone of 300 or less, which is provided by hydrogenating a purified rosin, and a colorless rosin derivative, having an acid value 150–500 and a Hazen color tone of 300 or less, which is provided by hydrogenating a purified rosin adduct of at least one unsaturated acid selected from the group consisting of an $\alpha,\beta$-unsaturated monocarboxylic acid and an $\alpha,\beta$-unsaturated dicarboxylic acid; and (D) 35–85% by weight, with respect to the total amount of the composition, of a powder of an extender.

2. The composition as set forth in claim 1, wherein the composition includes (E) 2–50% by weight, with respect to the total amount of the composition, of a vinyl compound.

3. The composition as set forth in claim 1, wherein said extender is selected from the group consisting of polyethylene, nylon, polyester, talc, silica, aluminum hydroxide, titanium oxide, barium sulfate, kaolinite, calcium carbonate, and phthalocyanine.

* * * * *

UNITED STATES PATENT AND TRADEMARK OFFICE
CERTIFICATE OF CORRECTION

PATENT NO. : 5,821,279

DATED : October 13, 1998

INVENTOR(S) : DOI et al.

It is certified that error appears in the above-identified patent and that said Letters Patent is hereby corrected as shown below:

```
Item [30], line 2, delete "Jan. 23, 1996" insert therefor

-- Jan. 13, 1996 --
```

Signed and Sealed this

Twenty-sixth Day of January, 1999

Attest:

Attesting Officer

*Acting Commissioner of Patents and Trademarks*